United States Patent [19]
Acovic et al.

[11] Patent Number: 5,389,567
[45] Date of Patent: Feb. 14, 1995

[54] METHOD OF FORMING A NON-VOLATILE DRAM CELL

[75] Inventors: Alexandre Acovic, Yorktown Heights, N.Y.; Ching-Hsiang Hsu, Hsin Chu, Taiwan, Prov. of China; Matthew R. Wordeman, Mahopac; Being S. Wu, Yorktown Heights, both of N.Y.

[73] Assignee: International Business Machines Corporation, Armonk, N.Y.

[21] Appl. No.: 241,136

[22] Filed: May 10, 1994

Related U.S. Application Data

[62] Division of Ser. No. 841,343, Feb. 25, 1992, Pat. No. 5,331,188.

[51] Int. Cl.⁶ .............................................. H01L 21/70
[52] U.S. Cl. ........................................ 437/52; 437/43; 437/48
[58] Field of Search ............................... 437/43, 48, 52

[56] References Cited
U.S. PATENT DOCUMENTS

| | | | |
|---|---|---|---|
| 4,363,110 | 12/1982 | Kalter et al. | 365/185 |
| 4,388,704 | 6/1983 | Bertin et al. | 365/185 |
| 4,471,471 | 9/1984 | DiMaria | 365/185 |
| 5,065,201 | 11/1991 | Yamauchi | 365/185 |
| 5,140,551 | 8/1992 | Chiu | 365/185 |

*Primary Examiner*—Tom Thomas
*Attorney, Agent, or Firm*—Scully, Scott, Murphy & Presser

[57] ABSTRACT

The present invention is directed to a one-transistor non-volatile DRAM cell having a two layer floating gate to allow the contents of a storage capacitor to be transferred to the floating gate during power interruptions. The first layer of the floating gate is separated from a storage node of the storage capacitor by a tunnel oxide to allow electron tunnelling between the floating gate and the storage capacitor. In another embodiment of the present invention, a dual electron injector structure is disposed between a one layer floating and the storage node to allow electrons to be injected between the floating gate and the storage node. In another embodiment of the present invention, an erase gate is implemented to remove the charge on the floating gate. The erase gate can be separated from the floating gate by a tunnel oxide or a single electron injector structure to allow electrons to travel from the floating gate to the erase gate.

10 Claims, 3 Drawing Sheets

METHOD OF FORMING A NON-VOLATILE DRAM CELL

This is a divisional of application Ser. No. 841,343, filed on Feb. 25, 1992, now U.S. Pat. No. 5,331,188.

BACKGROUND OF THE INVENTION

1. Field of the Invention

The present invention is directed to non-volatile semiconductor memory devices, and more particularly, to a DRAM cell having a tunnel oxide or dual electron injector structure disposed between a storage node and a floating gate for volatile data retention during power interruptions in a compact one transistor structure.

2. Description of the Prior Art

A dynamic random, access memory (DRAM) cell is very fast and compact but its contents must be refreshed periodically. In addition, a DRAM cell may be referred to as a volatile cell since information stored in the cell is completely lost when the power supply voltage applied to the memory cell is interrupted or turned off. As a result, when there is a power failure, information stored in present day random access memories is lost. Thus, there is a need for volatile dynamic random access memories (DRAM) in the electronic industry.

In contrast with volatile memory cells, the contents of a volatile memory cell, such as an electrically erasable programmable read only memory (EEPROM) cell, are preserved when the power supply is turned off. However, existing EEPROM cells are much slower than DRAM cells and are subject to wear each time information is written into the cell. Thus, EEPROMs cannot be used as the main memory of a computer.

To overcome the limitations of DRAMs and EEPROMs, various volatile RAM cells which merge DRAM and EEPROM cells together have been proposed. For example, in an article entitled "A New Architecture for the NVRAM—An EEPROM Backed-Up Dynamic Ram", by Y. Terada et al., IEEE J. Solid State Circuits, 23(1): p. 86 (1988), a DRAM cell is electrically coupled with an EEPROM cell to provide a non-volatile RAM cell. This cell consists of four n-channel transistors and a capacitor. In this cell, data can be transferred from DRAM to EEPROM in parallel for all cells. A similar non-volatile RAM cell that also allows the simultaneous transfer of the entire DRAM data to EEPROM is disclosed in an article entitled "A Novel NVRAM Cell Technology for High Density Applications" by Y. Yasmauchi et al., IEDM, p. 416 (1988). In this non-volatile RAM cell, a standard DRAM cell is electrically coupled with a conventional FLOTOX EEPROM cell. The cell consists of two transistors, a memory transistor having a floating gate and a storage capacitor. In an article entitled "Dynamic Non-Volatile and Electrically Erasable Read-Only Memories" by H. L. Kalter et al., IBM Technical Disclosure Bulletin, p. 540 (1982), a DRAM cell is made non-volatile by utilizing a four terminal floating gate device and a dual electron injector structure (DEIS) between the floating gate and a first control gate. A similar non-volatile DRAM cell is disclosed in an article entitled "Non-Volatile Dynamic Random Access Memory Cell with Built-In Boosting" by B. A. Kaufman et al., IBM Technical Disclosure Bulletin, p. 1182 (1985). In addition to using a DEIS stack between the floating gate and the control gate, this non-volatile DRAM cell utilizes a DEIS stack between a boost plate and the storage plate of an integrated voltage-boosting capacitor. Although all of the above non-volatile DRAM cells overcome some of the limitations of DRAMs and EEPROMs, they have more complicated cell structures, require larger cell areas and more complicated fabrication processes than existing DRAM cells.

One device dynamic volatile memory cells having the capability of storing data non-volatilely are known. For example, in commonly assigned U.S. Pat. No. 4,471,471, there is disclosed a one device non-volatile DRAM cell which requires a DEIS between a floating gate and a transfer gate. This device uses the floating gate for storing information non-volatilely during power failure and utilizes the DEIS stack over the transfer gate for data recovery after resumption of power. A main disadvantage of this cell is that since the DEIS stack is located on the bit line side of the cell, data cannot be transferred from the DRAM to the floating gate in parallel in all cells. The data first has to be read out by turning on the transfer transistor and reading the voltage on the bit line. Next, depending on the contents, the programming voltage has to be applied on the bit line one cell at a time which is very time consuming. Thus, there is a need to develop a non-volatile DRAM cell which overcomes the limitations of DRAMs and EEPROMs in a compact simplified cell structure that can be fabricated with simplified fabrication techniques.

SUMMARY OF THE INVENTION

The present invention is directed to a compact one-transistor non-volatile DRAM cell and a method for fabricating same. The present invention utilizes a two-layer floating gate to allow the contents of a storage capacitor to be transferred to and from the floating gate thereby making the cell non-volatile. The non-volatile portion of the cell includes a control gate, the two layer floating gate and a p+ source diffusion region formed in a substrate which acts as a bit line. The volatile portion of the cell includes the control gate, the two layer floating gate, the storage capacitor and a transfer transistor. The storage capacitor consists of a p+ drain diffusion region (storage node) formed in the substrate below the first layer of the floating gate. The first layer of the floating gate must be disposed close enough to the second p+ diffusion region to allow electrons to tunnel between the floating gate and the storage capacitor. This allows a charge to be transferred directly from the storage capacitor to the floating gate which is a feature not available in any prior art non-volatile DRAM cells. The transfer transistor is formed between the bit line and the storage node of the capacitor to allow data to be transferred to and from the bit line to the storage capacitor.

In another embodiment of the present invention a DEIS stack can be disposed between the floating gate and the surface of the substrate on the capacitor side of the cell to allow electrons to be injected between the floating gate and the storage capacitor. Since the DEIS is located between the storage node and the floating gate on the capacitor side of the cell, data can be transferred directly from the storage capacitor to the floating gate. In this embodiment, the floating gate can be a two layer or a one layer floating gate.

An array of non-volatile DRAM cells of the present invention can be used as part of a memory system. The memory system includes a word line decoder, a bit line decoder, precharge, sense amplifier and latch circuits, a multiplexer and a timing circuit. The memory system of the present invention has four operating modes: (1) DRAM, (2) TRANSFER, (3) non-volatile STORE and (4) RECALL/ERASE. During the DRAM mode the memory cell of the present invention operates exactly as a conventional DRAM cell and the floating gate is uncharged.

When a power interruption is detected or the power is turned off, the TRANSFER mode is activated. During TRANSFER, the content of the storage capacitor is transferred directly to the floating gate. This allows TRANSFER to be performed very fast since all memory cells on the array are simultaneously in TRANSFER. As a result, a small capacitor may be used to maintain power on the array, after a power failure is detected, to allow TRANSFER to be completed. Thus, the present invention eliminates the disadvantage of prior art one-transistor non-volatile DRAM cells which require data to be transferred from the capacitor to the floating gate one cell at a time.

When TRANSFER is activated, a strong positive voltage is applied to all word lines and the bit lines are grounded. If the state stored in the storage capacitor was a binary bit "1" electrons will tunnel from the storage diffusion region to the floating gate via the first layer of the floating gate. If a binary bit "0" was stored in the storage capacitor then electrons will not be injected into the floating gate and it will remain uncharged. Thus, the data stored in the previous DRAM operation will be transferred to the floating gate and will remain there (non-volatile STORE) until power is resumed and the RECALL/ERASE mode is activated.

After power is resumed, the RECALL/ERASE mode allows the storage capacitor to recall the data from the floating gate and erase the contents of the floating gate in order to resume operation in the DRAM mode. First, the data on the floating gates of all bit lines of a selected word line are transferred to a latch circuit. Next, the data stored on the floating gate is erased by applying a strong negative voltage to the selected word line and 0 V to all bit lines. This will cause electrons to tunnel from the floating gate to the drain diffusion region. Lastly, the data stored in the latch will be written back via the transfer transistor to the storage capacitors of each bit line on the selected word line. RECALL/ERASE must be repeated sequentially for each word line. After all cells of the array have been recalled, the DRAM operation may continue. The cell array of the present invention eliminates the "write" disturb problem of conventional EEPROM cells since all cells on a selected word line are written at the same time.

In another embodiment of the present invention an erase gate is implemented to allow the data in all word lines to be erased simultaneously during RECALL/ERASE thereby increasing the speed of the RECALL/ERASE mode.

A method for fabricating the non-volatile DRAM cell of the present invention is also disclosed. The non-volatile DRAM cell of the present invention can be fabricated by modifying known DRAM fabrication technology. This is accomplished by forming an additional polysilicon layer for the floating gate and making the gate oxide close to the drain thinner to allow for electron tunnelling.

The compact one-transistor non-volatile DRAM cell of the present invention combines the advantages of a DRAM cell with the non-volatility of EEPROM cells and overcomes the limitations of conventional DRAM and EEPROM cells. The compact cell structure of the present invention enables high density non-volatile DRAM cells to be realized. The non-volatile DRAM cell of the present invention has a higher write speed than a conventional EEPROM cell. In addition, the memory cell of the present invention has a higher reliability than conventional EEPROM cells since data is written on the floating gate only in case the power is interrupted. Moreover, the combination of DRAM and EEPROM functions in the same cell has the advantage that both have the same decoders and increases the transfer speed since TRANSFER occurs in parallel for all cells.

DETAILED DESCRIPTION OF THE INVENTION

Figure 1:
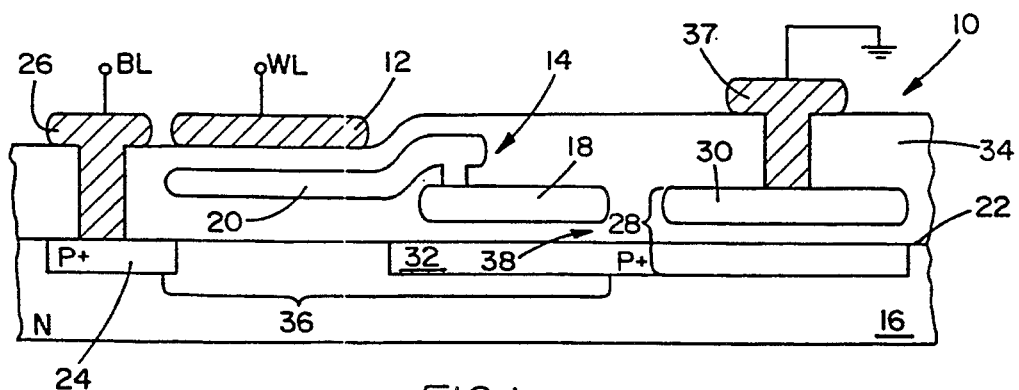
FIG. 1 is a cross-sectional view of the one-transistor non-volatile DRAM cell of the present invention.
Figure 2:
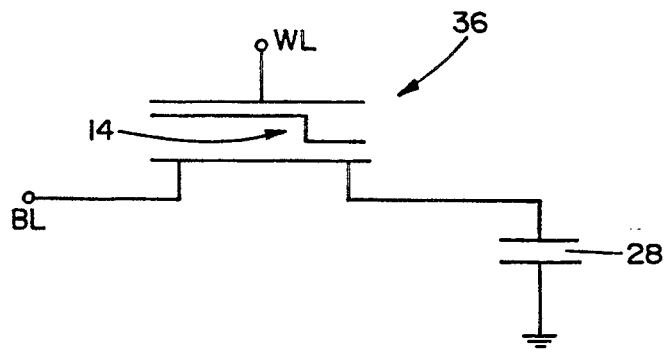
FIG. 2 is a circuit diagram of the one-transistor non-volatile DRAM cell of FIG. 1.

Referring to FIGS. 1 and 2, there is shown one embodiment of the one-transistor non-volatile DRAM cell 10 of the present invention. The non-volatile memory unit portion of cell 10 comprises control gate 12, two-layer floating gate 14 and n type substrate 16. Floating gate 14 consists of a first p doped polysilicon layer 18 and a second p doped polysilicon layer 20. The first layer 18 is formed closer to a surface 22 of substrate 16 than the second layer 20. A p+ source diffusion region 24 is formed in substrate 16. A contact 26 is connected to the p+ region 24 and forms a bit line. The contact 26 can be made of metal or polysilicon.

The DRAM portion of cell 10 comprises a storage capacitor 28, which consists of plate 30 and a p+ drain diffusion region (storage node) 32 separated by insulator 34, transfer transistor (FET switch) 36 floating gate 14 and the control gate 12. The transfer transistor 36 consists of control gate 12, floating gate 14, source diffusion region 24 and drain diffusion region 32. Floating gate 14 is a part of the transistor 36 in that the voltage from control gate 12 is capacitively coupled to floating gate 14 which acts as the gate of transfer transistor 36. The control gate 12 is connected to a word line terminal WL. The capacitor 28 is connected to ground via contact 37 which can be comprised of metal or polysilicon. As in conventional DRAM cells, the capacitor 28 of the present invention has to have a relatively large capacitance, typically ten times larger than the gate capacitance of transistor 36, in order for the DRAM cell to retain data for a sufficient period of time. As an illustrative example, the width of the control gate 12 can be 0.5 microns and the width of the plate 30 can be 5 microns. The capacitor 28 could be any capacitor used in a conventional DRAM cell such as a trench capacitor or a stacked capacitor. Although the cell 10 of the present invention will be described in connection with utilizing a PMOSFET 36, it should be understood that the features of the present invention can be adapted for use with an NMOSFET.

The first layer 18 of floating gate 14 must be formed close enough to diffusion region 32 to allow electrons to tunnel between the first layer 18 and diffusion region 32. This allows the floating gate 14 to be charged/discharged and hence transfer charge directly from the capacitor 28 to the floating gate. The thin oxide layer 38 between the first polysilicon layer 18 and drain diffusion region 32 is referred to as a tunnel oxide because it allows electrons to tunnel between layer 18 and region 32 under certain operating conditions that will be described below. It is also important to the cell 10 of the present invention that the second layer 20 be disposed farther away from surface 22 than the first layer 18 so that electrons cannot tunnel between the second layer 20 and storage node 32. As an illustrative example, the first polysilicon layer 18 may be formed at a distance of approximately 7 nm from the surface 22 of substrate 16. In addition, the second polysilicon layer 20 may be formed at a distance of 14 nm from the surface 22 of substrate 16 and 7 nm from the control gate 12. The thickness of the polysilicon layers 18 and 20 is typically between 500 and 2000 Angstroms.

Figure 3:
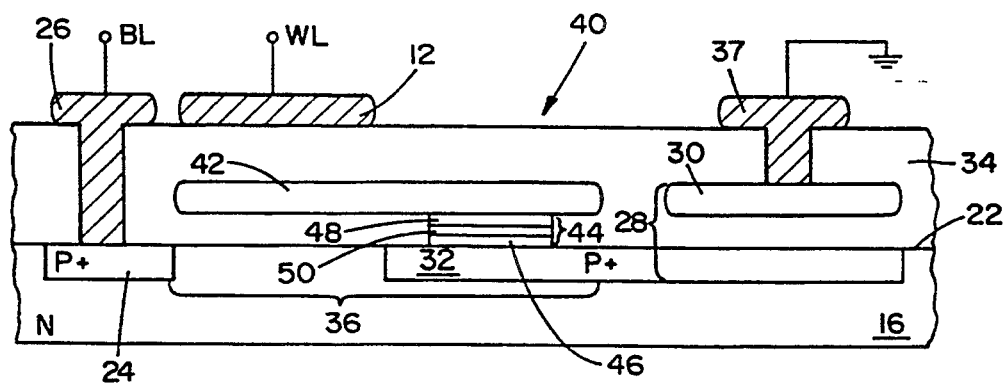
FIG. 3 is a cross-sectional view of another embodiment of the one-transistor non-volatile DRAM cell of the present invention.

Referring now to FIG. 3, there is shown another embodiment of the one-transistor non-volatile DRAM cell 40 of the present invention. In this embodiment, a single layer floating gate 42 can be implemented by disposing a dual electron injector structure (DEIS) 44, which is well known in the art, between the floating gate 42 and the diffusion region 32. The DEIS stack 44 will allow electrons to be injected between the floating gate 42 and storage node 32. Because of the thickness of DEIS stack 44, the oxide between the floating gate 42 and substrate surface 22 will not be thin enough to allow for electron tunnelling without utilizing the DEIS stack 44. By utilizing the DEIS 44 on the capacitor side of cell 40, data can be transferred directly from the capacitor 28 to floating gate 42. The DEIS 44 includes first and second silicon-rich silicon dioxide layers 46 and 48, respectively, separated by a silicon dioxide layer 50. Typically, each of layers 46, 48 and 50 can be 10 nm thick.

Figure 4:
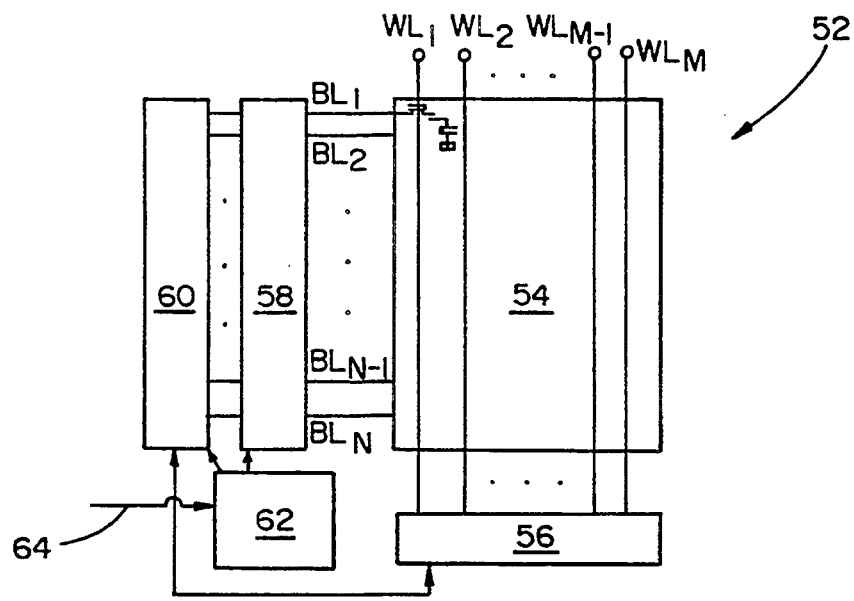
FIG. 4 illustrates a memory system of the present invention having an array of one-transistor non-volatile DRAM cells of the present invention.

FIG. 4 illustrates a memory system 52 which includes an M×N array 54 of non-volatile DRAM cells of the type shown in FIGS. 1 or 3. Each word line is connected to a word line decoder and driver circuit 56 which may employ conventional circuitry. Each bit line is connected to bit line decoder, precharge, sense amplifier and latch circuits 58 which may also utilize conventional circuitry. A multiplexer 60 which may be of any known type, is connected to the bit line decoder 58 and the word line decoder 56 to select particular cell(s) within the array 54. Data is input/output through multiplexer 60. A conventional timing circuit 62 which can operate in accordance with the present invention is connected to multiplexer 60, bit line decoder 58 and word line decoder 56. A power down signal 64 is input to timing circuit 62.

The memory system 52 has four operating modes: (1) DRAM, (2) TRANSFER, (3) non-volatile STORE and (4) RECALL/ERASE. Although the operating modes of system 52 will be described below with reference to the cell 10 of FIG. 1, it should be understood that the description below can also apply to a system 52 comprised of cells 40 of FIG. 3. During DRAM mode, the cells 10 of array 54 operate exactly as conventional DRAM cells. In this mode, the floating gate 14 is uncharged and the threshold voltage of the transistor 36 is approximately −1.0 V so that no modification (compared to a conventional DRAM cell) to the bit line and word line voltages are required. However, excessive word line voltages must be avoided, otherwise the floating gate 14 may be (dis)charged. The floating gate 14 plays a passive role in DRAM mode in that the voltage from control gate 12 is capactively coupled to floating gate 14 which acts as the gate of transfer transistor 36. It should be noted that if an NMOSFET is used in place of PMOSFET 36, the floating gate 14 would be charged with electrons during DRAM operation.

When a power failure is detected or the power is turned off, the contents of the storage capacitor 28 is transferred to the floating gate 14. Since electrons can tunnel between the capacitor 28 and floating gate 14 on the capacitor side of cell 10, data can be transferred directly from the capacitor 28 to floating gate 14 in parallel for all cells 10 in the array 54. Thus, the transfer from capacitor 28 (DRAM) to floating gate 14 (EEPROM) is performed very fast since all the cells 10 in the array 54 may be simultaneously in TRANSFER mode. The transfer time is on the order of 10 msec. Consequently, a relatively small capacitor (not shown) may be used to maintain power on the array 54 after a power loss is detected, to allow the TRANSFER mode to be completed. To transfer data from storage capacitor 28 to floating gate 14, first +15 V is applied to all word lines, and all bit lines are grounded. If the state stored in capacitor 28 is a binary bit "1" corresponding to −5 V on capacitor 28, the electric field is sufficiently high on the capacitor side of the PMOSFET 36 so that electrons tunnel from the drain region 32 through tunnel oxide 38 to the first layer 18 of floating gate 14. Since the Storage capacitor 28 is much bigger than the control gate capacitance, the charge stored in the storage capacitor 28 is sufficient to negatively charge the floating gate 14. Thus, the −5 V stored in capacitor 28 will be transferred to floating gate 14. On the other hand, if the voltage on capacitor 28 was 0 V representing a binary bit "0", the electric field in oxide layer 34 will not be strong enough for electrons to tunnel to the floating gate 14. As a result, no electrons will be injected into the first layer 18 of floating gate 14 and the floating gate 14 will remain uncharged. Thus, the contents stored in capacitor 28 during the previous DRAM mode of operation has been transferred permanently to the floating gate 14 and will remain there (non-volatile STORE) until power is resumed and the RECALL/ERASE mode is activated. It should be noted that when a binary bit "1" is previously stored in storage capacitor 28 during the DRAM mode, the threshold voltage of PMOSFET 36 will be changed to approximately +1.0. V due to electrons being injected into the floating gate 14. The cells 10 in which a binary bit "1" is previously stored become depletion mode devices. However, this is not a problem since immediately after TRANSFER, the power will be turned off and these cells will not be used anymore as a DRAM cell.

After power is again turned on or resumed, the RECALL/ERASE mode allows data to be recalled from the floating gate 14 to the storage capacitor 28. In addition, the data stored in floating gate 14 is erased in order to resume operation in DRAM mode. To recall the data stored in floating gate 14, first the storage capacitor 28 is charged to $-5$ V. This is accomplished by applying $-5$ V to all bit lines and $-5$ V to a selected word line. The $-5$ V applied to the selected word line will turn on the corresponding transfer transistors 36 and hence the $-5$ V applied to the bit lines will be transferred to capacitor 28. Next, all bit lines are precharged to 0 V and released (no voltage applied). 0 V is then applied to the selected word line (a value between the threshold voltages of MOSFET 36 with an empty floating gate and a floating gate full of electrons) and the voltage on each bit line is read and stored in a latch in latching circuit 58 by conventional techniques. The voltage on a particular bit line will be $-5$ V if a binary bit "1" was stored on the floating gate 14 or 0 V if a binary bit "0" was stored on floating gate 14. Next, the data stored in the floating gate 14 is erased by applying $-20$ V to the selected word line and 0 V to all bit lines. This causes electrons to tunnel to the p+ diffusion region 32 thereby emptying the floating gate 14 from remaining electrons and eliminating the charge on storage capacitor 28. In the last step of RECALL/ERASE, $-5$ V is applied to the selected word line and the data stored in the latch will be written back to each bit line of the selected word line. This data will be transferred via the transfer transistor 36 to the storage capacitor 28. Thus, after RECALL/ERASE is completed, each cell 10 on the selected word line will have an uncharged floating gate 14 and the data originally stored in the floating gates will be transferred to the storage capacitor of each cell 10.

Each of the above described steps of RECALL/ERASE must be repeated sequentially for each word line. The RECALL/ERASE time for each word line is approximately 10 msec. The total time to complete RECALL/ERASE for the array 54 is equal to the number of word lines M multiplied by 10 msec. It should be noted that during RECALL/ERASE, the already recalled cells must be periodically refreshed as during normal DRAM operation. After the whole cell array 54 has been recalled, DRAM operation may resume. Since all cells 10 on a selected word line are programmed at the same time, the cell array 54 of the present invention has no "write" disturb problem as in conventional EEPROM cells.

Figure 5:
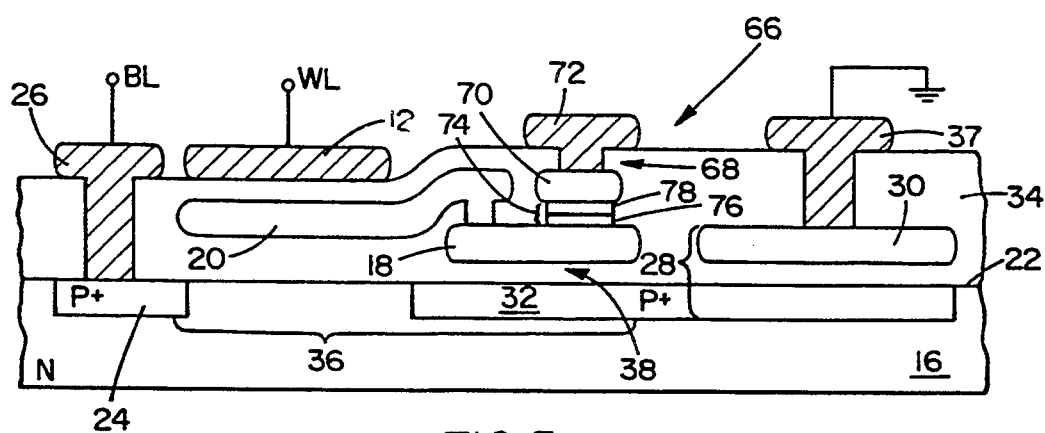
FIG. 5 is a cross-sectional view of another embodiment of the one-transistor non-volatile DRAM cell of the present invention.

Referring now to FIG. 5, there is shown another embodiment of the one-transistor non-volatile DRAM cell 66 of the present invention. A non-destructive erase is implemented in cell 66 by adding an additional erase gate 68. The erase gate 68 consists of a polysilicon plate 70 and a contact 72 which may be metal or polysilicon. The plate 70 must be fabricated close enough to first layer 18 of floating gate 14 in order to allow electrons to tunnel from first layer 18 to plate 70 to remove the charge stored on floating gate 14 when a binary bit "1" is stored in floating gate 14. As an example, plate 70 may be disposed at a distance of approximately 7 nm from the first layer 18. The erase gate 68 allows ERASE to be performed in all cells of all word lines simultaneously by applying a strong positive voltage on the erase gate 68 and a low positive voltage on all word lines. Due to the strong coupling between the word line and the floating gate 14, the voltage on the floating gate 14 will be close to $+2$ V so that storage capacitor 28 will not be disturbed.

In another embodiment of the cell 66 of FIG. 5, a single electron injector structure (SEIS) 74 can be implemented. SEIS stacks are well known in the art and will only allow electrons to be injected in one direction. The SEIS 74 will allow electrons to be injected from the first layer 18 of floating gate 14 to the erase gate 68 to remove the charge stored on floating gate 14 when a binary bit "1" is stored in the floating gate 14. In this embodiment, because of the thickness of the SEIS 74 the plate 70 will not be fabricated close enough to first layer 18 to allow for electron tunnelling without utilizing the SEIS 74. The SEIS 74 includes a silicon rich silicon dioxide layer 76 and a silicon dioxide layer 78. Typically, each of layers 76 and 78 can be 10 nm thick.

Figure 6:
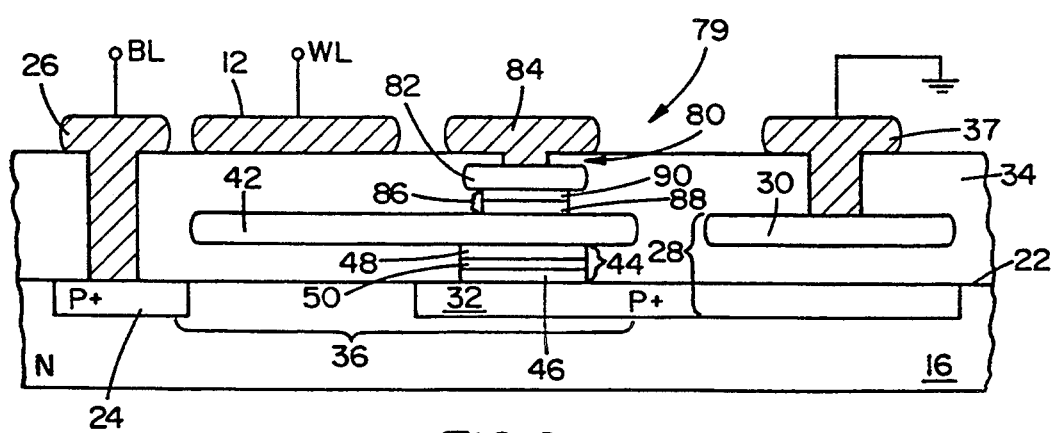
FIG. 6 is a cross-sectional view of another embodiment of the one-transistor non-volatile DRAM cell of the present invention.

As shown in FIG. 6, an erase gate 80 which operates in the same manner as described above, can also be implemented in the cell 40 of FIG. 3. The erase gate 80 consists of a polysilicon plate 82 and a contact 84. The plate 82 can be fabricated close enough to floating gate 42 in order to allow electrons to tunnel to plate 82. As an example, plate 82 can be disposed at a distance of approximately 7 nm from floating gate 42. Alternately, a SEIS stack 86 can be disposed between plate 82 and floating gate 42. The SEIS 86 includes a silicon rich silicon dioxide layer 88 and a silicon dioxide layer 90. As described above with regard to the cell 66 of FIG. 5, when the SEIS 86 is used in the cell 79 of FIG. 6, the plate 82 will not be fabricated close enough to floating gate 42 to allow electrons to tunnel to plate 70 without the SEIS 86.

The memory cells 66 or 79 can be utilized in the array 54 of memory system 52. All the operating modes of the memory system 52 composed of an array of memory cells 66 or 79 of FIGS. 5 or 6 are identical to that of a memory system 52 composed of memory cells of FIGS. 1 or 3 except for RECALL/ERASE. For the memory system consisting of an array of memory cells 66 or 79, RECALL/ERASE starts with all word lines at $-5$ V and all bit lines at 0 V to discharge all capacitors 28. Next, 0 V is applied to all word lines and $-5$ V is applied to all bit lines to charge storage capacitors 28 in cells where the floating gate was negatively charged representing a binary bit "1". Lastly, all floating gates 14 are erased by applying $+2$ V to all word lines and $+22$ V to erase gate 68 or 80. This causes electrons to tunnel from floating gate 14 or 42 to plate 70 or 82, respectively thereby removing the charge on floating gate 14 or 42, respectively. The total time to complete RECALL/ERASE utilizing an array of memory cells 66 or 79 is approximately 10 msec since ERASE is performed on all word lines simultaneously.

Figure 7:
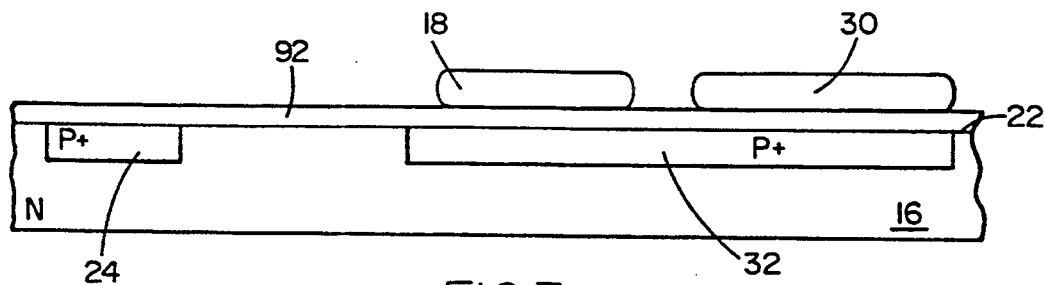
FIGS. 7-9 are cross-sectional views of the one-transistor non-volatile DRAM cell of the present invention at successive stages in accordance with a method of fabricating the non-volatile DRAM cell of FIG. 1.
Figure 8:
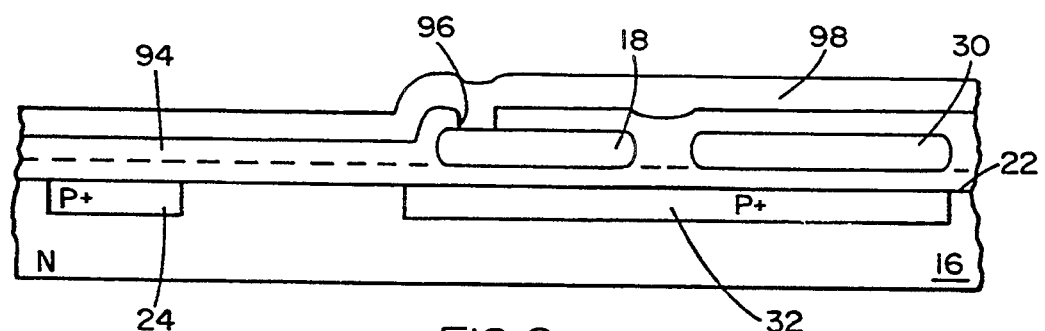
Figure 9:
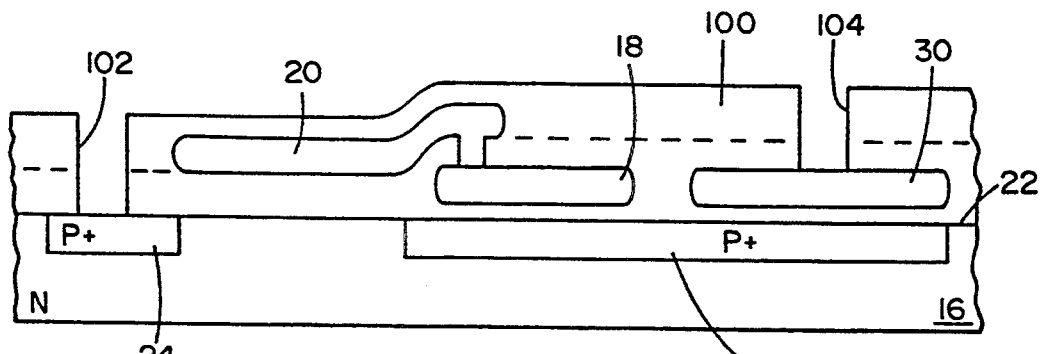

FIGS. 7 to 9 show cross-sectional views of the compact non-volatile DRAM cell 10 of FIG. 1 at successive stages in accordance with a method of fabricating the cell 10. As described below, the non-volatile DRAM cell 10 can be fabricated by modifying conventional DRAM fabrication technology. While the process will be described in connection with forming a PMOSFET, it should be understood by those skilled in the art of the present invention that the features of the present invention may be adapted for forming an NMOSFET.

Referring now to FIG. 7, there is shown a n type substrate 16 of monocrystalline silicon having disposed therein p+ diffusion regions 24 and 32. The impurity of diffusion regions 24 and 32 can be any suitable p type impurity, as for example, boron, and can be introduced into regions 24 and 32 by any suitable well known technique, as for example, diffusion or ion implantation. A thin layer of oxide 92 is deposited on substrate 16 by a well known thermal oxidation process. A layer of undoped polysilicon is then deposited on oxide layer 92 by any well known technique such as low pressure chemical vapor deposition. The polysilicon layer is then doped p type by known ion implantation techniques using boron as the p type dopant. The polysilicon layer is then etched to form first polysilicon layer 18 of floating gate 14 and capacitor plate 30. As shown in FIG. 8 a layer of oxide 94 is deposited by any well known wet or dry deposition process and etched by well known photolithographic masking and etching techniques to form via 96. A second layer of polysilicon 98 is then deposited and doped with a p type impurity by ion implantation. The layer 98 is then etched by the well known techniques described above to form second layer 20 of floating gate 14. Referring now to FIG. 9, a layer of oxide 100 is then deposited by the well known techniques described above. Thereafter, conventional photolithographic masking and etching steps are utilized to form contact holes 102 and 104. Lastly, as shown in FIG. 1, metallization or polysilicon is deposited to form contacts 26, 37 and control gate 12.

To fabricate the non-volatile DRAM cell 66 of FIG. 5, all the fabrication steps are identical to those described above except for the modifications described below. The second polysilicon layer 98 is etched to form polysilicon plate 70 as well as the second layer 20 of floating gate 14. In addition, photolithographic masking and etching techniques are used to form a contact hole to expose erase plate 70. Lastly, the metallization or polysilicon step further includes forming contact 72.

The primary use of the non-volatile DRAM cell of the present invention is in central memories of portable computers or in solid state replacement of hard-disks. In both cases, the present invention has the big advantage of having a faster write speed than a conventional EEPROM cell. In addition, the memory cell of the present invention has a higher reliability than a conventional EEPROM cell since data is written onto the floating gate only in case the power is interrupted. The compact cell structure of the present invention allows high density non-volatile DRAM cells to be realized. In addition, by combining DRAM and EEPROM functions in the same compact one-transistor cell, the present invention has the advantage that both have the same decoders and this also increases the transfer speed since transfer from the storage capacitor to the floating gate occurs in parallel for all cells. Moreover, since the transfer speed from the storage capacitor to the floating gate is on the order of 10 msec, a simple capacitor can be used as a short-time power backup when a power interruption is detected.

While the invention has been particularly shown and described with respect to preferred embodiments thereof, it will be understood by those skilled in the art that the foregoing and other changes in form and details may be made therein without departing from the spirit and scope of the invention, which should be limited only by the scope of the appended claims.

Having thus described the invention, what is claimed as new and desired to be secured by Letters Patent is:

1. A method for forming a non-volatile dynamic random access memory cell comprising the steps of:
   (a) providing a substrate of a first conductivity type having first and second spaced diffusion regions;
   (b) depositing a tunnel oxide layer on said substrate;
   (c) depositing a first layer of undoped polysilicon on said tunnel oxide layer and implanting a dopant of said second conductivity type in said first layer of undoped polysilicon;
   (d) selectively removing a portion of said first layer of polysilicon such that the remaining portion forms a first polysilicon region disposed above said first diffusion region, said first polysilicon region forming a first layer of a floating gate;
   (e) depositing a first oxide layer on said first polysilicon region and exposed portions of said tunnel oxide layer;
   (f) forming a via in said first oxide layer to expose an end of said first polysilicon region;
   (g) depositing a second layer of undoped polysilicon on said first oxide layer and said exposed end of said first polysilicon region and implanting a dopant of said second conductivity type in said second layer of undoped polysilicon;
   (h) selectively removing a portion of said second polysilicon layer such that the remaining portion contacts said first polysilicon region and is disposed between said first and second spaced diffusion regions, said remaining portion of said second polysilicon layer forming a second layer of said floating gate;
   (i) depositing a second oxide layer on said second polysilicon layer and exposed portions of said first oxide layer.

2. The method of claim 1 wherein said step of selectively removing a portion of said first polysilicon layer includes forming a second polysilicon region spaced from said first polysilicon region, said second polysilicon region being disposed above said first diffusion region and forming a capacitor plate.

3. The method of claim 1 further including the step of forming a control gate on said second oxide layer over said first and second layers of said floating gate, and a metallic contact to said second diffusion region.

4. The method of claim 1 wherein said tunnel oxide layer is deposited by a high temperature post oxidation anneal of thermally grown dry oxide.

5. The method of claim 1 wherein said tunnel oxide layer is deposited to a thickness of approximately 7 nm.

6. The method of claim 5 wherein said first oxide layer is deposited to a thickness of approximately 7 nm.

7. The method of claim 6 wherein said second oxide layer is deposited to a thickness of approximately 7 nm.

8. The method of claim 1 wherein said step of selectively removing a portion of said polysilicon layer includes forming an erase plate comprised of a portion of said second polysilicon layer spaced from said second layer of said floating gate and disposed above said first layer of said floating gate.

9. The method of claim 8 further including the step of forming a control gate on said second oxide layer over said second layer of said floating gate and a portion of said first layer of said floating gate, metallic contacts to said second diffusion region and said erase plate.

10. The method of claim 8 wherein said first oxide layer is deposited to a thickness such that said erase gate is separated from said first layer of said floating gate by approximately 7 nm.

* * * * *